(12) United States Patent
Hidaka (10) Patent No.: US 10,581,432 B2
(45) Date of Patent: Mar. 3, 2020

(54) LEVEL SHIFT CIRCUIT AND METHOD FOR LEVEL SHIFTING

(71) Applicant: LAPIS Semiconductor Co., Ltd., Yokohama (JP)

(72) Inventor: Yuto Hidaka, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/142,152

(22) Filed: Sep. 26, 2018

(65) Prior Publication Data

US 2019/0103871 A1    Apr. 4, 2019

(30) Foreign Application Priority Data

Sep. 29, 2017    (JP) ................. 2017-189344

(51) Int. Cl.
*H03K 19/003*    (2006.01)
*H03K 19/0185*    (2006.01)

(52) U.S. Cl.
CPC ............ *H03K 19/00315* (2013.01); *H03K 19/018521* (2013.01)

(58) Field of Classification Search
CPC ..... H03K 19/018521; H03K 19/00315; H03K 17/162; H03K 19/20; H03K 17/302; H03K 19/0013; H03K 3/037; H03K 17/56; H03K 5/13; H03K 5/135; H03K 5/153
USPC .......................................... 327/333
See application file for complete search history.

(56) References Cited

U.S. PATENT DOCUMENTS 7,969,191 B2 *   6/2011   Nedalgi ........... H03K 19/01852
326/81

FOREIGN PATENT DOCUMENTS

JP         2008-177755 A        7/2008

* cited by examiner

*Primary Examiner* — John W Poos
(74) *Attorney, Agent, or Firm* — Rabin & Berdo, P.C.

(57) ABSTRACT

A level shift circuit which comprises a voltage applying part configured to apply predetermined voltage to a first node intermittently. An input part receives an input signal and applies reference voltage to a second node when a signal level of the input signal is equal to a first voltage level. A switching part connects the second node and the first node with each other during the voltage applying part does not apply the predetermined voltage to the first node. The switching part cuts off the connection between the second node and the first node during the voltage applying part applies the predetermined voltage to the first node. An inverter provides a phase-inverted signal of the signal given to the first node as an output signal.

6 Claims, 4 Drawing Sheets

LEVEL SHIFT CIRCUIT AND METHOD FOR LEVEL SHIFTING

BACKGROUND OF THE INVENTION

1. Field of the Invention

The present invention relates to a level shift circuit which shifts a signal level of an electronic signal and a method for level shifting.

2. Description of the Related Art

An electrical circuit having a plurality of circuit blocks operated at different source voltage each other includes level shift circuits which shift a signal level of their own electronic signal to a source voltage level of destination circuit block. So that, signals can be exchanged between circuit blocks.

As an example of such level shift circuit mentioned above, there is known a level shift circuit comprising a latch constituted by a pair of inverter devices connecting each own output end to the other's input end. The level shift circuit further includes a pair of transistors which are set in an ON state or an OFF state in response to the above electronic signals (for example, Japanese Patent Application Laid-Open No. 2008-177755).

In such a level shift circuit mentioned above, the pair of inverter devices are operated at a source voltage of the destination circuit block. The pair of transistors are set in an ON state or an OFF state complementarily in response to a binary logic level (high level or low level) represented by the above electronic signal. Because of the operation of the pair of transistors, either one of the input end and the output end of the above-mentioned latch is set to the ground voltage. Therefore, the latch provides a level shifted signal from a signal level of an electronic signal representing a binary logic level to a binary signal level having a source voltage of destination circuit block. In such a configuration, the signal level of an output signal after level shifting can be stabilized although the level of the electronic signal which is input to the level shift circuit is unstable.

SUMMARY OF THE INVENTION

In such level shift circuit mentioned above, a problem is raised as will be described below when a signal level of the binary electronic signal is changed which is input to the level shift circuit.

For example, either one of the pair of transistors changes its state from an OFF state to an ON state in response to this electronic signal. The level of an output end of the inverter device of which the output end is connected to the one transistor get lower. On the other hand, within a short period from an instance of transition from an OFF state to an ON state of the one transistor, a p-channel transistor of the inverter device which is connected to that one transistor takes an ON-state.

A through current flows between p-channel transistor of the inverter device and above-described one transistor, thereby causing increase of unwanted power consumption.

It is therefore an object of the present invention to provide a level shift circuit and a method for level shifting, which are capable of level shifting of an input signal coming thereto with a less power consumption.

A level shift circuit according to the present invention is a level shift circuit comprising: a voltage applying part configured to apply a predetermined voltage to a first node intermittently; an input part configured to receive an input signal and apply a reference voltage to a second node when a signal level of the input signal is equal to a first voltage level; a switching part configured to connect the second node and the first node with each other during the voltage applying part does not apply the predetermined voltage to the first node, and cut off the connection between the second node and the first node during the voltage applying part applies the predetermined voltage to the first node; and an inverter configured to provide a phase-inverted signal of the signal given to the first node as an output signal.

A level shift circuit according to the present invention is a level shift circuit comprising: a voltage applying part configured to apply a predetermined voltage to a first node which output an output signal intermittently; an input part configured to receive an input signal and apply a reference voltage to a second node when a signal level of the input signal is equal to a first voltage level; and a switching part configured to connect the second node and the first node with each other during the voltage applying part does not apply the predetermined voltage to the first node, and cut off the connection between the second node and the first node during the voltage applying part applies the predetermined voltage to the first node.

A level shift circuit according to the present invention is a level shift circuit comprising: a first inverter configured to receive a pre-charge signal and to output a first signal based on both a first source voltage and the ground voltage; a second inverter configured to receive the first signal and to output a second signal based on both the first source voltage and the ground voltage; and an input part connected to the ground voltage and a node supplying the ground voltage to the first inverter, the input part being controlled in response to an input signal varying based on both a second source voltage and the ground voltage.

A method for shifting an input signal so as to generate an output signal according to the present invention is a method, wherein a signal level of the input signal varies within a range from a reference voltage level up to a first voltage level, and a signal level of the output signal varies within a range from a reference voltage level up to a second voltage level comprising: applying the second voltage to a first node intermittently while applying the reference voltage to a second node when a signal level of the input signal is equal to the first voltage level; connecting the second node and the first node during the second voltage is not applied to the first node, and cutting off the connection between the second node and the first node during the second voltage is applied to the first node; and inverting a signal phase of the first node so as to obtain the output signal.

A level shift circuit according to the present invention generates an output signal by shifting a signal level of an input signal as will be described below.

At first, predetermined voltage is applied to a first node intermittently so that the first node is set to a state of predetermined voltage.

When a signal level of an input signal is equal to a first voltage level, a reference voltage is applied to the first node through a second node during the predetermined voltage is not applied to the first node. As a result, a signal level of the first node is set to the reference voltage. A signal phase of the first node (corresponding to the reference voltage) is inverted so that an output signal is obtained. The signal level of the output signal is equal to the predetermined voltage.

When a signal level of an input signal is equal to the reference voltage level, the signal level of the first node is maintained at the state of predetermined voltage during the predetermined voltage is not applied to the first node. As a result, a signal phase of the first node (corresponding to the predetermined voltage) is inverted so that the output signal is obtained. The signal level of the output signal is equal to the reference voltage.

According to the level shift circuit of the present invention, a signal level of an input signal is shifted so that an output signal is generated.

In addition, in the level shift circuit according to the present invention, during the above-mentioned predetermined voltage is applied to the first node, the connection between the first node and the second node is cut off. The second node is set to a state of the reference voltage in response to the input signal.

No through-current based on the predetermined voltage and the reference voltage flows into the first node during transition of the signal level of the input signal, or during the signal level of the input signal is unstable. Therefore, increasing of the power consumption accompanied by the through-current can be reduced.

Thus, the present invention can perform a level shifting of an input signal coming thereto with a less power consumption.

DETAILED DESCRIPTION OF THE INVENTION

An embodiment of the present invention will now be described below in detail with reference to the drawings.

Figure 1:
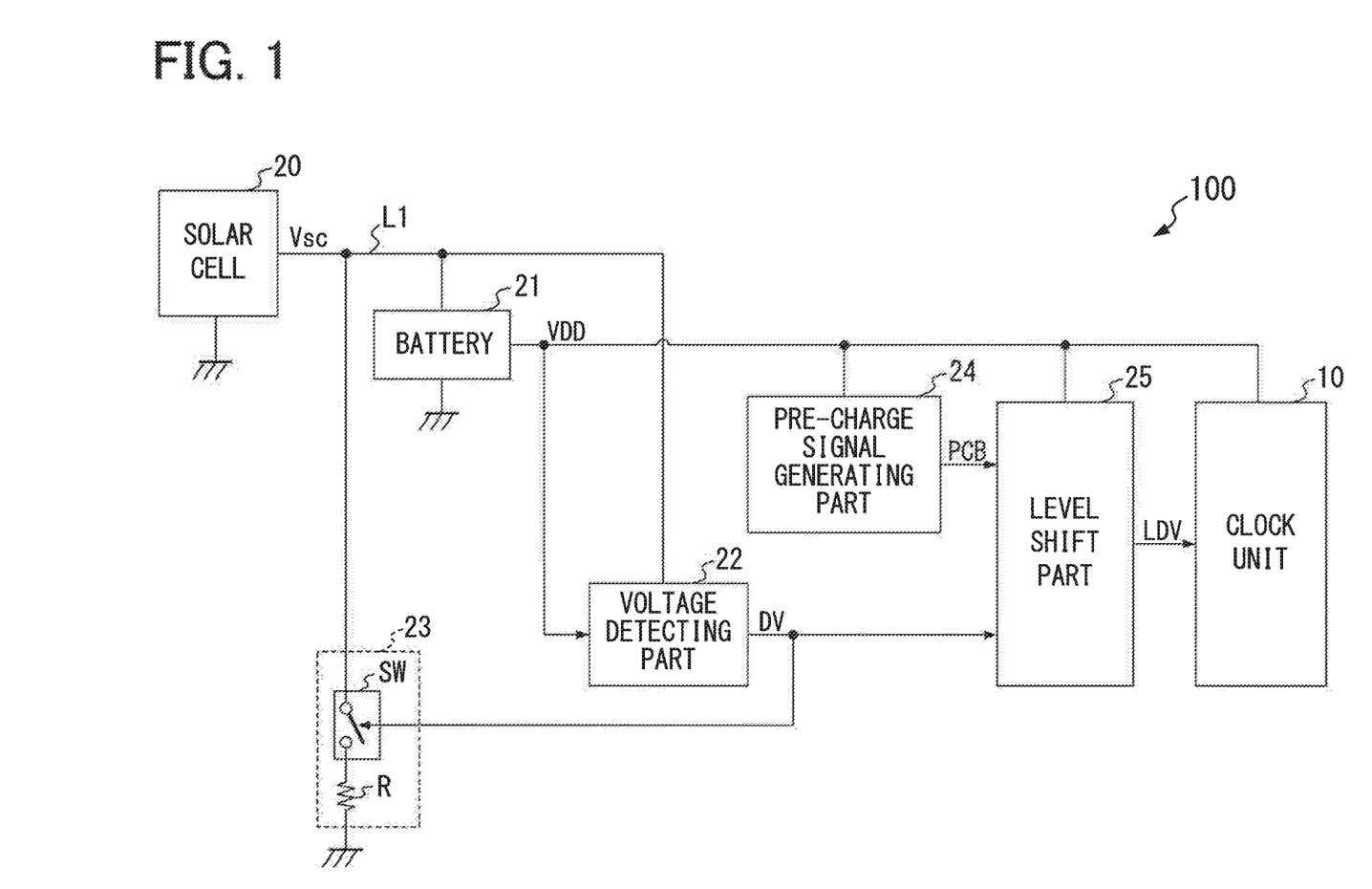
FIG. 1 is a block diagram illustrating a configuration of a solar clock system 100 including a level shift circuit according to the present invention.

FIG. 1 is a block diagram illustrating a solar clock system 100 which includes a level shift circuit according to the present invention.

The solar clock system 100 includes a clock unit 10, a solar cell 20, a battery 21, a voltage detecting part 22, a voltage reducing circuit 23, a pre-charge signal generating part 24, and a level shift part 25.

The clock unit 10 includes a time display part which indicates time by rotating a plurality of indicator needles (e.g., un hour hand, a minute hand and a second hand), or indicates time through display device such as liquid crystal display device. The clock unit 10 includes a control part which controls the time display part and performs power management control in response to a voltage detecting signal LDV described below.

The solar cell 20 generates electricity in accordance with incident light entered thereto so as to generate a direct current generation voltage Vsc. The solar cell 20 supplies the generation voltage Vsc through a line L1 to the battery 21, the voltage detecting part 22, and the voltage reducing circuit 23.

The battery 21 is a secondary cell which is charged by the generation voltage Vsc supplied from the solar cell 20. The battery 21 supplies a direct current source voltage VDD generated by the charging to the clock unit 10, the voltage detecting part 22, the pre-charge signal generating part 24, and the level shift part 25.

The voltage detecting part 22 receives the supplement of the generation voltage Vsc so as to perform a voltage detecting operation described below.

The voltage detecting part 22 determines that a voltage value of the source voltage VDD is higher than a predetermined upper limit of the voltage value or not. The voltage detecting part 22 generates a voltage detecting signal DV which signal in turn indicating a result of the determination.

For example, in case a voltage value of the source voltage VDD is lower than the upper limit voltage value, the voltage detecting part 22 generates the voltage detecting signal DV having a level which is equal to the ground potential GND corresponding to a signal level indicating the logic level 0. In case a voltage value of the source voltage VDD is higher than the upper limit voltage value, the voltage detecting part 22 generates the voltage detecting signal DV having a level which is equal to the generation voltage level Vsc corresponding to a signal level indicating the logic level 1.

The voltage detecting part 22 supplies the voltage detecting signal DV to the voltage reducing circuit 23 and the level shift part 25.

The voltage reducing circuit 23 includes a resistor R whose one end is grounded and a switching device SW which connects the other end of the resistor R and the line L1 each other when the device takes an ON state. The switching device SW takes an OFF state in case the voltage detecting signal DV indicates the logic level 0. In case the voltage detecting signal DV indicates the logic level 1, the switching device SW takes an ON state and electrically connects the other end of the resistor R to the line L1.

In this configuration, the voltage reducing circuit 23 grounds the line L1 through resistor R when the voltage detecting signal DV indicates the logic level 1, in other words, when the source voltage VDD is higher than the upper limit voltage value. A part of an output current based on the generation voltage Vsc generated at the solar cell 20 flows into the resistor R and is consumed. Accordingly, increasing of a voltage value of the generation voltage Vsc is prevented. The voltage value of the generation voltage Vsc is limited to a lower voltage than the upper limit voltage value mentioned above although the power generation amount is increased because of receiving high-intensity light.

In the voltage reducing circuit 23, the voltage value of the generation voltage Vsc can be reduced to a lower voltage than a maximum allowable charging voltage of the battery 21 regardless of light intensity impinging on the solar cell 20. Then, the battery 21 can be protected from any trouble or damages.

Figure 2:
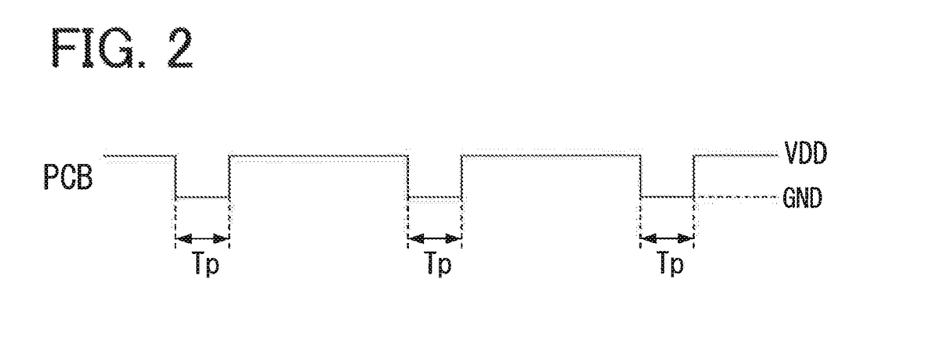
FIG. 2 is a chart showing an illustrative example of pre-charge signal PCB.

The pre-charge signal generating part 24 generates a pre-charge signal PCB. As shown in FIG. 2, the pre-charge signal PCB shows pre-charge pulse of negative polarity intermittently having the ground potential GND (e.g., 0 volt) only in a predetermined period Tp. In other periods, the signal level of the pre-charge signal PCB is equal to the source voltage VDD. A period of the pre-charge pulse in the pre-charge signal PCB may be fixed to a predetermined stable period, or may be changed periodically or at random times. In sum, as shown in FIG. 2, the pre-charge signal generating part 24 as an oscillation signal generating part generates an oscillation signal, which alternately and repeatedly takes either one of a state of the ground voltage GND and a state of the source voltage VDD, as the pre-charge signal PCB.

The pre-charge signal generating part 24 supplies the pre-charge signal PCB to the level shift part 25.

The level shift part 25 performs a level shifting of a signal level of the voltage detecting signal DV. The signal level of the voltage detecting signal DV varies within a range from the ground voltage level GND up to the generation voltage level Vsc. The level shift part 25 generates a voltage detecting signal LDV whose signal level varies within a range from the ground voltage level GND up to the source voltage level VDD. The level shift part 25 supplies the voltage detecting signal LDV to the clock unit 10.

Figure 3:
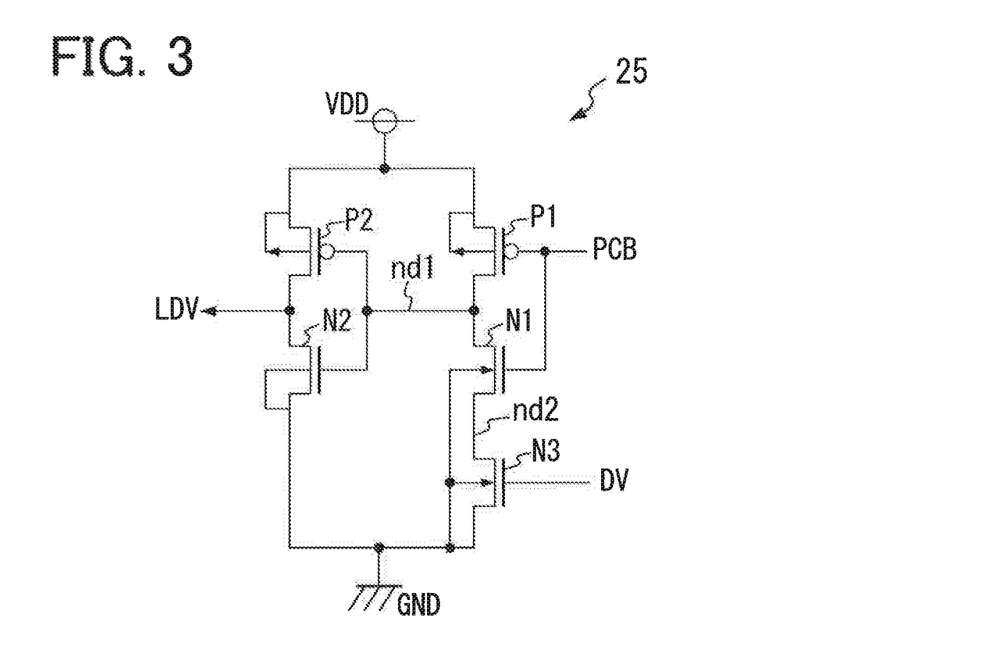
FIG. 3 is a circuit diagram showing an example of an internal configuration of a level shift part 25.

FIG. 3 is a circuit diagram showing an example of an internal configuration of the level shift part 25. In the example shown in FIG. 3, the level shift part 25 includes p-channel MOS (Metal Oxide Semiconductor) transistors P1 and P2, and n-channel MOS transistors N1 to N3.

The source voltage VDD is applied to a source and a back gate of the transistor P1. A drain of the transistor P1 is connected to a drain of the transistor N1 through a node nd1. The pre-charge signal PCB as shown in FIG. 2, which is generated at the pre-charge signal generating part 24, is supplied to a gate of respective transistors P1 and N1.

The ground voltage GND is applied to a back gate of the transistor N1. A source of the transistor N1 is connected to a drain of the transistor N3 through a node nd2.

The ground voltage GND is applied to a source and a back gate of the transistor N3. The voltage detecting signal DV is supplied to a gate of the transistor N3.

The source voltage VDD is applied to a source and a back gate of the transistor P2. The ground voltage GND is applied to a source and a back gate of the transistor N2. Respective gates of the transistors P2 and N2 are connected to the node nd1. Drains of these transistors P2 and N2 are connected to each other. The transistors P2 and N2 constitute an inverter. The transistors P2 and N2 invert a logic level of a signal of the node nd1 so as to obtain the voltage detecting signal LDV.

In this embodiment, a transistor having high current driving capability can be adopted as each of the transistors P1, N1 and N2 so as to enhance operation speed of the circuit. In conventional level shifter circuit, through current is increased in case current driving capability of both of PMOS transistor and NMOS transistor are set higher. In this case, it is necessary to set the current driving capability in consideration of a balance of current flows which flows when both PMOS transistor and NMOS transistor take an ON state. Accordingly, size of the transistors are limited based on the setting. On the other hand, in the level shift part 25 of this embodiment, when the transistor P1 takes an ON state, the transistor N1 takes an OFF state. The transistors N1 and N3 take an ON state, the transistor P1 takes an OFF state. Therefore, the PMOS transistor and the NMOS transistor are not influenced by each other with respect to their current driving capability. The current driving capability and the size of transistor can be set freely in each of the PMOS transistor and the NMOS transistor.

An internal operation of the level shift part 25 will now be described below with reference to FIG. 4.

Figure 4:
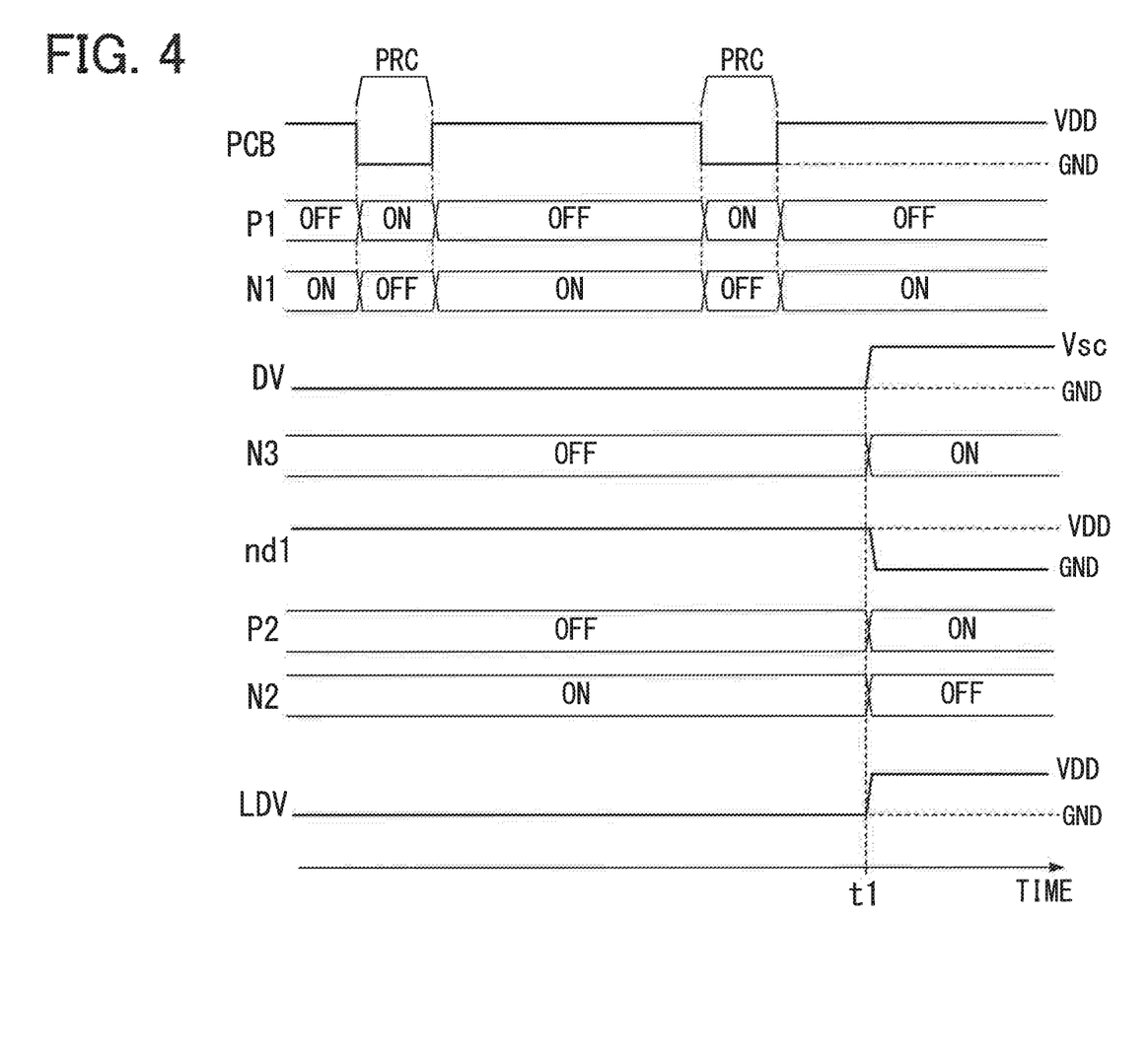
FIG. 4 is a time chart showing internal operation of the level shift part 25.

As shown in FIG. 4, for example, during a signal level of the pre-charge signal PCB is equal to the source voltage level VDD which represents the logic level 1, the transistor P1 takes an OFF state and the transistor N1 takes an ON state.

The transistor P1 takes an ON state and the transistor N1 takes an OFF state during a pre-charge period PRC. The pre-charge period PRC is a period when a signal level of the pre-charge signal PCB is equal to the ground voltage level GND (e.g., 0 volt) which represents the logic level 0. Accordingly, the transistor P1 applies the source voltage VDD to the node nd1 during the pre-charge period PRC. In other words, the transistor P1 performs so-called pre-charge. Because of the pre-charge, node nd1 is charged and a signal level of the node nd1 becomes equal to the source voltage VDD which represents the logic level 1.

The pre-charge signal generating part 24 generates the pre-charge signal PCB which shows the pre-charge pulse intermittently having the ground potential GND. The transistor P1 applies the source voltage VDD to the node nd1 at a timing of the pre-charge pulse shown in the pre-charge signal PCB intermittently. The transistor P1 performs pre-charge operation to the node nd1 by the source voltage VDD.

During the pre-charge period PRC, the transistor N1 cuts off the connection between the transistor N3 and the node nd1. The inverter constituted by transistors P2 and N2 inverts the logic level of a signal level of the node nd1 so as to obtain the voltage detecting signal LDV indicating the inversed logic level. Therefore, the inverter (constituted by P2 and N2) inverts a phase of a signal of the node nd1 so as to obtain the voltage detecting signal LDV.

In addition, as shown in FIG. 4, during the pre-charge period PRC, the signal level of the node nd1 is equal to the source voltage VDD indicating the logic level 1. The inverter (constituted by P2 and N2) inverts the phase of the signal level of the node nd1 (corresponding to VDD) so as to obtain the voltage detecting signal LDV having the ground voltage level GND.

After the pre-charge period PRC shown in FIG. 4, the level shift part 25 performs a level shift processing described below on the voltage detecting signal DV. The signal level of the voltage detecting signal DV varies within a range from the ground voltage level GND up to the generating voltage level Vsc.

When the pre-charge signal PCB changes its state from a state of the ground voltage GND (corresponding to the logic level 0) to a state of the source voltage VDD (corresponding to the logic level 1), the connection between the transistor P1 and the node nd1 is cut off accompanied by connection between transistor N3 and the node nd1 through transistor N1.

As shown in FIG. 4, the transistor N3 takes an OFF state during the voltage detecting signal DV as an input signal is in a state of the ground voltage GND (corresponding to logic level 0). Accordingly, the node nd1 stays in a high impedance state during a time period from an trading edge of a first pre-charge period PRC to a leading edge of a second pre-charge period PRC succeeding to the first pre-charge period PRC, so as to maintain a state of the source voltage VDD (corresponding to logic level 1) which has been set during the preceding pre-charge period PRC. During the time period, the inverter (constituted by P2 and N2) generates the voltage detecting signal LDV having the ground potential GND (corresponding to logic level 0) as shown in FIG. 4.

At a time point t1 shown in FIG. 4, the voltage detecting signal DV changes its state from a state of the ground voltage GND (corresponding to the logic level 0) to a state of the generation voltage Vsc (corresponding to the logic level 1) so that the transistor N3 changes its state from an OFF state to an ON state. The node nd1 is discharged through the transistors N3 and N1 as a path. A signal level of the node nd1 drops from a state of source voltage VDD to a state of ground voltage GND. After the time point t1 in FIG. 4, the inverter (constituted by P2 and N2) provides the voltage detecting signal LDV having a level which is equal to source voltage level VDD (corresponding to the logic level 1).

The level shift part 25 performs a level shifting of the voltage detecting signal DV whose signal level changes within a range from the ground potential GND as a reference voltage up to the generation voltage level Vsc. The level shift part 25 generates the voltage detecting signal LDV whose signal level changes within a range from the ground potential GND up to a source voltage level VDD.

In the level shift part 25, the transistor N1 takes an OFF state as long as the transistor P1 which performs the pre-charge takes an ON state. The connection between the transistor N3 and the node nd1 is cut off during a pre-charge period PRC that the transistor P1 applies the source voltage VDD to the node nd1.

During the pre-charge period PRC, no through current based on the source voltage VDD and the ground voltage GND flows into the node nd1 through a current path which is constituted by transistors P1, N1 and N3, regardless of a signal level of the voltage detecting signal DV as an input signal.

During a period other than the pre-charge period PRC, the transistor P1 takes an OFF state so that the source voltage VDD is not applied to the node nd1. No through current based on the source voltage VDD and the ground voltage GND flows into the node nd1 through a current path (constituted by P1, N1 and N3) although during a period other than the pre-charge period PRC.

In the level shift part 25, no through current flows into the node nd1 when a signal level of the voltage detecting signal DV changes between the source voltage level VDD and the ground potential GND, or a signal level of the voltage detecting signal DV is in an unstable state.

In the level shift part 25, a signal level of an input signal can be shifted with a less power consumption regardless of a state of the voltage detecting signal DV as an input signal.

In the level shift part 25, during the pre-charge period PRC that the source voltage VDD is applied to the node nd1, the transistor N1 is in an OFF-state so as to prevent that a state of the voltage detecting signal DV is reflected in the node nd1. During a period other than the pre-charge period PRC, the transistor N1 is in an ON-state so that a state of the voltage detecting signal DV is reflected in the node nd1. During that period, the transistor P1 takes an OFF-state so that the applying of the source voltage VDD to the node nd1 is stopped.

It is therefore, within a short period from an instance that the voltage detecting signal DV changes its state from the state of the ground potential GND (corresponding to logic level 0) to a state of the generation voltage level Vsc (corresponding to logic level 1), the node nd1 changes its state from a state of the source voltage level VDD (corresponding to logic level 1) to the state of the ground potential GND (corresponding to logic level 0). The voltage detecting signal LDV which changes its state rapidly from the state of the ground potential (corresponding to logic level 0) to the state of the source voltage level VDD (corresponding to logic level 1) can be obtained following to that state of the node nd1.

When the voltage detecting signal DV changes its state from a state of the generation voltage level Vsc (corresponding to logic level 1) to a state of the ground potential GND (corresponding to logic level 0), a state of the source voltage level VDD (corresponding to logic level 1) is reflected in the voltage detecting signal LDV. Shortly after completing of the pre-charge, the voltage detecting signal LDV having a level corresponding to the source voltage VDD is provided.

In a configuration which is shown in FIG. 3, an inverter (constituted by P2 and N2) operates to cause the logic levels of the respective ones of the voltage detecting signals DV and LDV to be uniformed at generating the voltage detecting signal LDV which is generated by a level shift of a signal level of the voltage detecting signal DV.

Figure 5:
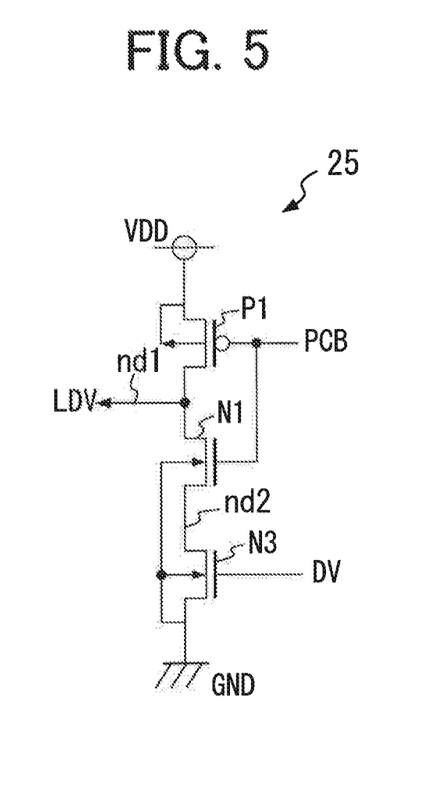
FIG. 5 is a circuit diagram showing another example of internal configuration of the level shift part 25.

In case a receiving device of the voltage detecting signal LDV, that is, the clock unit 10 is configured to be able to receive a signal which is generated by inverting a logic level of the voltage detecting signal DV, a signal of the node nd1 may directly be provided as the voltage detecting signal LDV as shown in FIG. 5.

In a configuration which is shown in FIG. 1, the voltage detecting signal DV is adopted to an input signal which is an object of the level shifting. The voltage detecting signal DV is having the generation voltage Vsc which takes unstable state in accordance with a variation of generating amount by the solar cell 20. A signal generated on the basis of a stable source voltage may be utilized as an input signal which is an object of the level shifting.

An input signal as an object of the level shifting is not limited to the voltage detecting signal DV. Various signals may be adopted as an input signal, such as a variety of control signals, sensor signals, or information signals such as image data or audio data.

The level shift circuit according to the present invention performs the level shift with respect to an input signal (corresponding to DV) whose signal level changes within a range from a reference voltage level (corresponding to GND) to a first voltage level (corresponding to Vsc) so as to generate an output signal (corresponding to LDV) whose signal level changes within a range from the reference voltage level to a second voltage level (corresponding to VDD).

In the above embodiment, the pre-charge signal generating part 24 generates the pre-charge signal PCB at first. The transistor P1 applies the source voltage VDD to the node nd1 at a timing of the pre-charge pulse shown in the pre-charge signal PCB so as to pre-charge the node nd1 intermittently by the source voltage VDD. A signal level of the node nd1 is set to the source voltage level VDD. It is not limited to the pre-charge signal generating part 24 and the transistor P1 that a method to set a signal level of the node nd1 to the source voltage level VDD. It is only or merely required that a voltage applying part applies the source voltage VDD to the node nd1 intermittently.

In the above embodiment, the transistor N3 receives the voltage detecting signal DV as an input signal at its gate. The transistor N3 takes an OFF state when a signal level of the voltage detecting signal DV is equal to the ground potential GND. The transistor N3 takes an ON state when a signal level of the voltage detecting signal DV is equal to the generation voltage Vsc so as to apply the ground voltage GND to the node nd2. A different device other than the transistor N3 may be adopted to receive an input signal and to perform the above operation in response to a signal level of the input signal. It is merely required that an input part receives the voltage detecting signal DV as an input signal and applies the ground voltage GND to a node nd2 when a signal level of the input signal is equal to the generation voltage level Vsc.

In the above embodiment, the transistor N1 connects the node nd1 and the node nd2 during the pre-charge pulse is not shown in the pre-charge signal PCB. The transistor N1 cuts off the connection between the node nd1 and the node nd2 during the pre-charge pulse is shown in the pre-charge signal PCB. A different device other than the transistor N1 may be adopted to connect and to disconnect between the node nd1 and the node nd2. It is merely required that a switching part connects the node nd1 and the node nd2 during the above voltage applying part does not apply the source voltage VDD to the node nd1 and that the switching part cuts off the connection between the node nd1 and the node nd2 during the source voltage VDD is applied to the node nd1. For another example, bipolar transistors may be utilized as the transistors P1, P2, N1, N2 and N3 instead of the MOS transistors in the above embodiment.

According to the first aspect of the present invention, a level shift circuit includes a voltage applying part, an input part, a switching part, and an inverter. The voltage applying part (corresponding to P1) applies a predetermined voltage (corresponding to VDD) to a first node (corresponding to nd1) intermittently. The input part (corresponding to N3) receives an input signal (corresponding to DV) and applies a reference voltage (corresponding to GND) to a second node (corresponding to nd2) when a signal level of the input signal is equal to a first voltage (corresponding to Vsc). The switching part (corresponding to N1) connects the second node to the first node during the voltage applying part does not apply the predetermined voltage to the first node. The switching part cuts off the connection between the second node and the first node during the voltage applying part applies the predetermined voltage to the first node. The inverter (corresponding to P2 and N2) inverts a phase of a signal which is input to the first node so as to generate an output signal (corresponding to LDV).

According to the second aspect of the present invention, a level shift circuit includes a voltage applying part, an input part, and a switching part. The voltage applying part (corresponding to P1) applies a predetermined voltage (corresponding to VDD) intermittently to a first node (corresponding to nd1) which provides an output signal. The input part (corresponding to N3) receives an input signal (corresponding to DV) and applies a reference voltage (corresponding to GND) to a second node (corresponding to nd2) when a signal level of the input signal is equal to a first voltage (corresponding to Vsc). The switching part (corresponding to N1) connects the second node to the first node during the voltage applying part does not apply the predetermined voltage to the first node. The switching part cuts off the connection between the second node and the first node during the voltage applying part applies the predetermined voltage to the first node.

In a configuration which is shown in FIG. 3, the transistors P1 and N1 operate together as a first inverter. The transistors P1 and N1 receive the source voltage VDD and the ground voltage GND. The transistors P1 and N1 invert a phase of the pre-charge signal PCB as an oscillation signal so as to send out the inverted signal to the node nd1. The transistor N3 shown in FIG. 3 operates as an input part. The transistor N3 receives the voltage detecting signal DV as an input signal and stops supplying of a reference voltage to the first inverter during a signal level of the voltage detecting signal DV is in a state of ground voltage level GND.

According to the third aspect of the present invention, a level shift circuit includes a first and a second inverter, and an input part. The first inverter (constituted by P1 and N1) receives a pre-charge signal (corresponding to PCB) and provides a first signal based on a first source voltage level (corresponding to VDD) and the ground potential (corresponding to GND). The second inverter (constituted by P2 and N2) receives the first signal and provides a second signal (corresponding to LDV) based on the first source voltage level and the ground potential. The input part (corresponding to N3) is connected to a node (corresponding to nd2) which supply the ground voltage to the first inverter and to the ground voltage (GND). The input part (corresponding to N3) is controlled in response to an input signal (corresponding to DV) based on a second source voltage level (corresponding to Vsc) and the ground potential.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2017-189344 filed on Sep. 29, 2017, the entire contents of which are incorporated herein by reference.

What is claimed is:

1. A level shift circuit comprising:
   a voltage applying part including a first transistor configured to receive a pre-charge signal which shows a pre-charge pulse intermittently and to perform pre-charge operation of a first node with a pre-determined voltage at a timing that said pre-charge pulse is shown in said pre-charge signal;
   an input part configured to receive an input signal and apply a reference voltage to a second node when a signal level of said input signal is equal to a first voltage level;
   a switching part configured to connect said second node and said first node with each other during said voltage applying part does not apply said predetermined voltage to said first node, and cut off the connection between said second node and said first node during said voltage applying part applies said predetermined voltage to said first node; and
   an inverter configured to provide a phase-inverted signal of the signal given to said first node as an output signal.

2. The level shifter circuit according to claim 1, wherein said switching part includes a second transistor configured to connect said second node and said first node with each other during said pre-charge pulse is not shown in said pre-charge signal and to cut off the connection between said second node and said first node during said pre-charge pulse is shown in said pre-charge signal, and
   said input part includes a third transistor configured to be in an OFF state when a signal level of said input signal is equal to said reference voltage level and to be in an ON state when the signal level of said input signal is equal to said first voltage level so as to apply said reference voltage to said second node.

3. The level shifter circuit according to claim 2, wherein said first transistor is a p-channel MOS transistor configured to receive said pre-charge signal on its own gate edge, said second transistor is an n-channel MOS transistor configured to receive said pre-charge signal on its own gate edge, said third transistor is an n-channel MOS transistor configured to receive said input signal on its own gate edge.

4. A level shift circuit comprising:

a voltage applying part including a first transistor configured to receive a pre-charge signal which shows a pre-charge pulse intermittently and to perform pre-charge operation of a first node with a pre-determined voltage at a timing that said pre-charge pulse is shown in said pre-charge signal, the first node outputting an output signal;

an input part configured to receive an input signal and apply a reference voltage to a second node when a signal level of said input signal is equal to a first voltage level; and a switching part configured to connect said second node and said first node with each other during said voltage applying part does not apply said predetermined voltage to said first node, and cut off the connection between said second node and said first node during said voltage applying part applies said predetermined voltage to said first node.

5. A level shift circuit comprising:

a first inverter configured to receive a pre-charge signal which shows a pre-charge pulse intermittently and to provide a first signal based on both a first source voltage and the ground voltage at a timing that said pre-charge pulse is shown in said pre-charge signal;

a second inverter configured to receive said first signal and to provide a second signal based on both said first source voltage and the ground voltage; and an input part connected to a ground having the ground voltage and a node supplying the ground voltage to said first inverter, said input part being controlled in response to an input signal varying based on both a second source voltage and the ground voltage.

6. A method for shifting an input signal so as to generate an output signal, wherein a signal level of said input signal varies within a range from a reference voltage level up to a first voltage level, and a signal level of said output signal varies within a range from a reference voltage level up to a second voltage level, comprising:

receiving a pre-charge signal which shows a pre-charge pulse intermittently and performing pre-charge operation of a first node with said second voltage at a timing that said pre-charge pulse is shown in said pre-charge signal;

applying said reference voltage to a second node when a signal level of said input signal is equal to said first voltage level;

connecting said second node and said first node during said second voltage is not applied to said first node, and cutting off the connection between said second node and said first node during said second voltage is applied to said first node; and inverting a signal phase of said first node so as to obtain said output signal.

* * * * *